United States Patent
Sekine et al.

(10) Patent No.: US 9,293,416 B2
(45) Date of Patent: Mar. 22, 2016

(54) FUNCTIONAL MATERIAL

(71) Applicant: Napra Co., Ltd., Tokyo (JP)

(72) Inventors: Shigenobu Sekine, Tokyo (JP); Yurina Sekine, Tokyo (JP)

(73) Assignee: NAPRA CO., LTD., Tokyo (JP)

( * ) Notice: Subject to any disclaimer, the term of this patent is extended or adjusted under 35 U.S.C. 154(b) by 0 days.

(21) Appl. No.: 14/456,461

(22) Filed: Aug. 11, 2014

(65) Prior Publication Data

US 2015/0054158 A1   Feb. 26, 2015

(30) Foreign Application Priority Data

Aug. 21, 2013   (JP) ................. 2013-171259

(51) Int. Cl.
| | | |
|---|---|---|
| H01L 23/522 | (2006.01) | |
| H01L 23/532 | (2006.01) | |
| B22F 1/00 | (2006.01) | |
| H01L 23/48 | (2006.01) | |
| H01L 23/498 | (2006.01) | |

(52) U.S. Cl.
CPC ........ *H01L 23/53233* (2013.01); *B22F 1/0003* (2013.01); *H01L 23/481* (2013.01); *H01L 23/49883* (2013.01); *H01L 23/5328* (2013.01); *H01L 23/49827* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 5,508,562 | A * | 4/1996 | Horie et al. | 257/772 |
| 5,716,663 | A * | 2/1998 | Capote et al. | 156/277 |
| 6,207,259 | B1 * | 3/2001 | Iino | H05K 3/4069 174/250 |
| 6,370,013 | B1 * | 4/2002 | Iino et al. | 361/306.3 |
| 2009/0084588 | A1 * | 4/2009 | Sekine | H01L 21/76898 174/257 |
| 2010/0252616 | A1 | 10/2010 | Shearer et al. | |
| 2010/0301485 | A1 * | 12/2010 | Sekine et al. | 257/769 |
| 2012/0211549 | A1 | 8/2012 | Yamakami et al. | |
| 2013/0277850 | A1 | 10/2013 | Sekine et al. | |
| 2014/0193650 | A1 | 7/2014 | Nakano et al. | |

FOREIGN PATENT DOCUMENTS

| | | |
|---|---|---|
| EP | 2657962 A1 | 10/2013 |
| EP | 2756913 A1 | 7/2014 |
| JP | 2002-198654 A | 7/2002 |
| JP | 2004-363052 A | 12/2004 |
| JP | 3869859 B2 | 1/2007 |
| JP | 2011-023497 A | 2/2011 |
| JP | 5124693 B1 | 1/2013 |
| WO | 98/39781 A1 | 9/1998 |
| WO | 2013/038817 A1 | 3/2013 |

OTHER PUBLICATIONS

Extended European Search Report dated Jan. 7, 2015, issued in corresponding EP Patent Application No. 14275173.4 (7 pages).

* cited by examiner

*Primary Examiner* — Duy T Nguyen
*Assistant Examiner* — Bo Bin Jang
(74) *Attorney, Agent, or Firm* — Westerman, Hattori, Daniels & Adrian, LLP

(57) ABSTRACT

A functional material includes at least two kinds of particles selected from the group consisting of first metal composite particles, second metal composite particles and third metal composite particles. The first metal composite particles, the second metal composite particles and the third metal composite particles each contain two or more kinds of metal components. The melting point $T_1$(° C.) of the first metal composite particles, the melting point $T_2$(° C.) of the second metal composite particles and the melting point $T_3$(° C.) of the third metal composite particles satisfy a relationship of $T_1 > T_2 > T_3$.

6 Claims, 6 Drawing Sheets

FUNCTIONAL MATERIAL

This application claims a priority of Japanese Application No. 2013-171259 filed in Japan on Aug. 21, 2013.

BACKGROUND OF THE INVENTION

1. Field of the Invention

The present invention relates to a functional material. The term "functional material" as used herein refers to a material which can serve a desired function based on its inherent properties such as electrical properties, dielectric properties, magnetic properties, optical properties, bonding properties or sealing properties. The functional material according to the present invention can be used as a wiring material, an electrode material, a filling material, a sealing material or a bonding material.

2. Description of the Related Art

As a means for realizing a three-dimensional circuit configuration in electronic devices such as various scales of integrated circuits, various types of semiconductor elements or chips thereof, there has been proposed a TSV (through-silicon-via) technology of providing a circuit substrate with a large number of through electrodes and stacking such circuit substrates. By applying the TSV technology to the three-dimensional circuit configuration, many functions can be packed into a small footprint. Moreover, important electrical pathways between elements can be dramatically shortened to increase processing speed. Japanese Patent No. 3869859 discloses a via hole structure essential for the TSV technology.

The via hole structure disclosed in Japanese Patent No. 3869859 must contain a binder and/or a reactive monomer or polymer in addition to a high melting point metal, a low melting point metal or metal alloy and a crosslinking agent. In a cured state within a via hole, a polymeric network generated by crosslinking of organic constituents of a conductive adhesive coexists with an alloyed metal network.

After the via hole structure disclosed in Japanese Patent No. 3869859 is cured within the via hole, the polymeric network coexists with the alloyed metal network, as described in its specification. This degrades electrical conductivity accordingly.

Also, there is a problem inherent in diffusion bonding of metal, i.e., the formation of voids, cracks or the like due to Kirkendall voids. Kirkendall voids arise as atomic vacancies (lattice), which arise from the asymmetry of interdiffusion, accumulate without disappearing. In the case of a Sn/Cu interface, for example, since Sn diffuses less than Cu, the vacancies accumulate at the interface between the intermetallic compound and Cu, thereby forming Kirkendall voids. Such Kirkendall voids may grow into a larger void or crack, deteriorating the reliability or quality of electrodes and therefore causing disconnection. Japanese Patent No. 3869859 does not disclose any countermeasure against this problem.

A similar problem arises when a wiring planar conductive pattern is formed on a surface of a wafer along with or independently of through electrodes, when semiconductor chips are connected to each other in an electronic device, e.g., in the form of three-dimensional system-in-package (3D-SiP), or when sealing is performed in a liquid crystal device or the like.

SUMMARY OF THE INVENTION

It is an object of the present invention to provide a functional material which enables a wiring conductor (trace), an electrode, a filling structure, a sealing structure or a bonding structure to be formed without having voids or cracks, and an electronic device employing the same.

It is another object of the present invention to provide a functional material which enables formation of a wiring conductor (trace), an electrode, a filling structure, a sealing structure or a bonding structure that melts at a low temperature but the melting point of which becomes higher after solidification, and an electronic device employing the same.

In order to attain at least one of the above objects, the present invention provides a functional material, a substrate having a trace made of the functional material, and an electronic device employing the substrate.

The functional material according to the present invention comprises at least two kinds of particles selected from the group consisting of first metal composite particles, second metal composite particles and third metal composite particles. The first metal composite particles, the second metal composite particles and the third metal composite particles each contain two or more kinds of metal components. The melting point $T1(°C.)$ of the first metal composite particles, the melting point $T2(°C.)$ of the second metal composite particles and the melting point $T3(°C.)$ of the third metal composite particles satisfy a relationship of $T1>T2>T3$.

When the above functional material is used for a trace, an electrode, a filling structure, a sealing structure or a bonding structure, the asymmetry of interdiffusion can be mitigated by a combination of the first, second and third metal composite particles having different melting points $T1$, $T2$ and $T3$, so that the accumulation of atomic vacancies (lattice) can be avoided to suppress the formation of Kirkendall voids. Therefore, it becomes possible to provide a trace, an electrode, a filling structure, a sealing structure or a bonding structure free from Kirkendall voids or the like. In general, the diffusion bond region constitutes a nanocomposite structure having a film thickness or layer thickness of nanometer order (equal to or less than 1 μm).

Also, it is possible to set the melting point $T3(°C.)$ of the third metal composite particles low and set the melting point $T1(°C.)$ of the first metal composite particles high, for example. This enables formation of a trace, an electrode, a filling structure, a sealing structure or a bonding structure that melts at a low temperature but the melting point of which becomes higher after solidification.

Since the first metal composite particles, the second metal composite particles and the third metal composite particles each contain two or more kinds of metal components, the melting points $T1$, $T2$ and $T3$ can be adjusted to satisfy the relationship of $T1>T2>T3$ by selecting the metal components to be contained.

The functional material according to the present invention contains at least two kinds of particles selected from the first metal composite particles, the second metal composite particles and the third metal composite particles; it is not required to contain all three kinds of particles. For example, it may contain the first and second metal composite particles, the first and third metal composite particles, or the second and third metal composite particles. The combination may be determined in view of the type and relative amount of components in the first, second and third metal composite particles.

Specifically, the first metal composite particles may contain Cu and at least one element selected from the group consisting of Si, B, Ti, Al and Ag. The second metal composite particles may contain Sn, Cu and at least one element selected from the group consisting of Si, B, Ti, Al and Ag. The third metal composite particles may contain Sn, Bi, Ga and at least one element selected from the group consisting of Si, B, Ti, Al and Ag. Alternatively, the third metal composite particles may contain Sn, Bi, In, Sb and at least one element selected from the group consisting of Ga, Si, B, Ti, Al and Ag.

The functional material according to the present invention may be prepared by dispersing the first metal composite particles, the second metal composite particles and the third metal composite particles in a fluid dispersion medium. Specifically, it may be used as a fluid functional material such as a paste for wiring, filling, an electrode, sealing or bonding.

The present invention also provides an electronic device employing the foregoing functional material. In the present invention, the electronic device may be any type of electrical product based on the technology of electronics. Typical examples include an interposer, various types of semiconductor chips and a three-dimensional system-in-package (3D-SiP).

According to the present invention, as understood from above, the following advantages can be obtained.
(a) It is possible to provide a functional material which enables a wiring conductor (trace), an electrode, a filling structure, a sealing structure or a bonding structure to be formed without having Kirkendall voids or the like, and an electronic device employing the same.
(b) It is possible to provide a functional material which enables formation of a wiring conductor (trace), an electrode, a filling structure, a sealing structure or a bonding structure that melts at a low temperature but the melting point of which becomes higher after solidification, and an electronic device employing the same.

The present invention will be more fully understood from the detailed description given hereinbelow and the accompanying drawings which are given by way of illustration only, and thus not to be considered as limiting the present invention.

DESCRIPTION OF THE PREFERRED EMBODIMENTS

Figure 1:
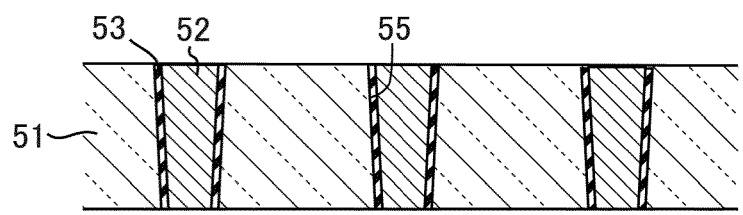
FIG. 1 is a drawing showing an embodiment of an electronic device employing a functional material according to the present invention.

The functional material according to the present invention takes the form of powder including at least two kinds of particles selected from first metal composite particles, second metal composite particles and third metal composite particles. However, available components are not limited to the three kinds of particles, i.e., the first to third metal composite particles, and it may contain four or more kinds of metal particles or metal composite particles.

The first metal composite particles, the second metal composite particles and the third metal composite particles each contain two or more kinds of metal components. Preferably, the first to third metal composite particles have a nanocomposite structure. The nanocomposite structure refers to a structure in which crystals or amorphous bodies of metal/alloy or compounds thereof are integrated and combined in nanometer order. The particle shape of the first to third metal composite particles may be uniform or irregular. Also, they may take any shape such as a spherical shape, a scale shape or a flattened shape.

In the functional material according to the present invention, the first to third metal composite particles are different in composition from each other so that the melting points $T1(°C.)$, $T2(°C.)$ and $T3(°C.)$ satisfy the relationship of $T1>T2>T3$.

Specific examples of the first to third metal composite particles are as follows.

1. First Metal Composite Particle

Specifically, the first metal composite particles may contain Cu and at least one element selected from the group consisting of Si, B, Ti, Al and Ag. The composition ratio of the components may be set within the following range.
Cu: 99.9 wt % or less
Sn: 50 wt % or less
Si, B, Ti, Al and Ag: 0.01 wt % or less Particles of Cu or an alloy thereof are preferably coated with an oxidation-inhibiting film. A suitable oxidation-inhibiting film is a plating formed by plating the particles of Cu or an alloy thereof with Ag or Sn. Alternatively, they may be coated with a resin that sublimes at 150° C. or more.

2. Second Metal Composite Particle

Specifically, the second metal composite particles may contain Sn, Cu and at least one element selected from the group consisting of Si, B, Ti, Al and Ag. The composition ratio of the components may be set within the following range.
Sn: 98 wt % or less
Cu: 30 wt % or less
Si, B, Ti, Al and Ag: 0.01 wt % or less 3. Third Metal Composite Particle (1) As one option, the third metal composite particles may contain Sn, Bi, Ga and at least one element selected from the group consisting of Si, B, Ti, Al and Ag. In this case, the composition ratio of the components may be set within the following range.
Sn: 40 to 80 wt %
Bi: 15 to 60 wt %
Ga: 0.1 wt % or less
Al: 1 wt % or less
Si, B, Ti and Ag: 0.01 wt % or less (2) As another option, the third metal composite particles may contain Sn, Bi, In, Sb and at least one element selected from the group consisting of Ga, Si, B, Ti, Al and Ag. In this case, the composition ratio of the components may be set within the following range.
In: 20 wt % or less with respect to Sn
Bi; 20 wt % or less with respect to Sn
Sb: 20 wt % or less with respect to Sn
Ga, Si, B, Ti, Al and Ag: 1 wt % or less In the above cases, the melting points T1, T2 and T3 are as follows.

T1=1100° C. to 500° C.
T2=400° C. to 250° C.
T3=250° C. or less

The functional material contains at least two kinds of particles selected from the first to third metal composite particles; it is not required to contain all three kinds of particles. For example, it may a combination of the first metal composite particles having Cu as a main component and the second metal composite particles having Sn as a main component or a combination of the first metal composite particles and the third metal composite particles having Sn as a main component.

The functional material according to the present invention may be prepared by dispersing the first metal composite particles, the second metal composite particles and the third metal composite particles in a fluid dispersion medium. As the fluid dispersion medium, there may be used various types of organic binders, aqueous dispersion mediums or volatile organic dispersion mediums. Since various types of such dispersion mediums have been known in the art, the most suitable one should be chosen. Specifically, the fluid functional material may be used as a conductive paste for wiring, a paste for filling, a paste for an electrode, a paste for sealing or a paste for bonding.

The foregoing functional material according to the present invention may be used for various types of electronic devices as a material for wiring, a material for an electrode, a material for filling, a material for bonding or a material for sealing. Hereinbelow, specific examples will be described with reference to FIGS. 1 to 7.

Figure 2:
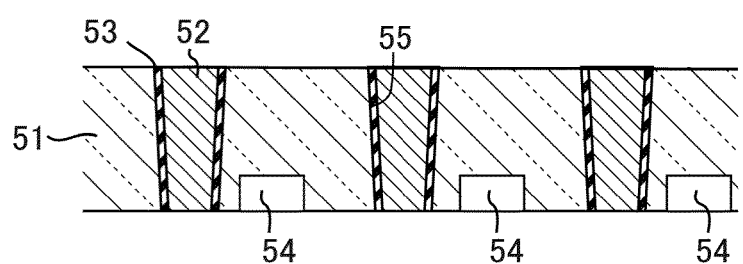
FIG. 2 is a drawing showing another embodiment of an electronic device employing a functional material according to the present invention.

At first, FIG. 1 shows an electronic device in which columnar conductors 52 are disposed in a substrate 51. Typically, the electronic device shown in FIG. 1 may be an interposer. Alternatively, it may be a semiconductor chip in which semiconductor circuit elements 54 are additionally formed in the substrate 51, as shown in FIG. 2. For example, such a semiconductor chip may be a memory chip or a logic chip.

In FIGS. 1 and 2, the substrate 51 may be a semiconductor substrate such as Si substrate, SiC substrate or SOI substrate. Also, it may be an inorganic or organic insulating substrate, a dielectric substrate, a magnetic substrate or a composite substrate thereof. For example, the substrate 51 has a thickness of tens of micrometers.

The columnar conductor 52 is disposed in a vertical hole 55 passing through the substrate 51 in the thickness direction. For example, the vertical hole 55 and the columnar conductor 52 may have a diameter of, but not limited to, 60 μm or less. The diameter may further be reduced to 10 μm or less.

The columnar conductor 52 is electrically insulated from the substrate 51, which is a semiconductor substrate such as Si substrate, by an electrical insulating layer 53 provided on the inner wall surface of the vertical hole 55.

The electrical insulating layer 53 may be an oxide or nitride film formed by modifying the inner wall surface of the vertical hole 55 or an insulating layer made of an inorganic functional material, an organic functional material or a combination thereof filled into the vertical hole 55. When the electrical insulating layer 53 is an inorganic insulating layer, specifically, it may be formed such that an insulating paste containing insulating particles, Si particles and an organic Si compound is filled into the vertical holes 55 and hardened. In the process of forming the electrical insulating layer 53, the organic Si compound is reacted with the Si particles inside the vertical holes 55 to form Si—O bond network filling up the space around the insulating particles. Preferably, the reaction between the organic Si compound and the Si particles is allowed to proceed under vacuum while being heated, for example, within a temperature range of 130° C. to 150° C.

The columnar conductor 52 is made of the functional material according to the present invention. In the case of FIG. 1, the molten metals are filled into the vertical hole 55. Preferably, filling is performed under a reduced-pressure atmosphere within a vacuum chamber. It is also possible to adopt a differential pressure filling process, wherein the internal pressure of the vacuum chamber is increased after the pressure reduction.

Then, the molten metals filled in the vertical holes 55 are solidified under pressure. This makes it possible to form a high-quality conductive path free from gaps or voids. The columnar conductor 52 may also be formed with a disperse functional material prepared by dispersing the functional material according to the present invention in a dispersion medium.

When the columnar conductor 52 is made of the functional material according to the present invention, the asymmetry of interdiffusion can be mitigated by a combination of at least two kinds of particles selected from the first, second and third metal composite particles having different compositions and melting points T1, T2 and T3, so that the accumulation of atomic vacancies (lattice) can be avoided to suppress the formation of Kirkendall voids. Thus, the columnar conductor 52 free from Kirkendall voids or the like can be formed.

Figure 3:
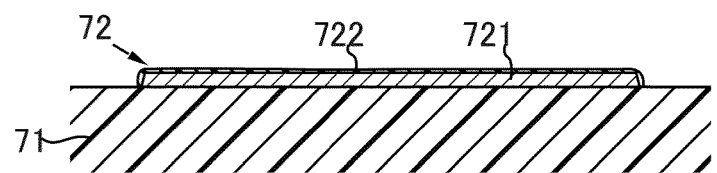
FIG. 3 is a drawing showing still another embodiment of an electronic device employing a functional material according to the present invention.

FIG. 3 shows an electronic device in which a planar trace 72 in a predetermined pattern is formed on one surface of a substrate 71. The trace 72 includes a metallization layer 721 and a synthetic resin film 722. In the metallization layer 721, metal components are diffusion bonded to each other. The diffusion bonding may be liquid-phase diffusion bonding or solid-phase diffusion bonding; the choice depends on the process employed.

The metallization layer 721 is covered with the synthetic resin film 722. Depending on its thickness, the synthetic resin film 722 serves as an insulating film or a protective film that is poor in insulation. The synthetic resin film 722 may be made of a photosensitive resin.

The metallization layer 721 contains the first metal composite particles, the second metal composite particles and the third metal composite particles. The first to third metal composite particles each contain two or more kinds of metal components, as described above. The melting points T1, T2 and T3 can be adjusted to satisfy the relationship of T1>T2>T3 by selecting the metal components to be contained.

In the metallization layer 721 of the trace 72, the metal components contained in the first metal composite particles, the second metal composite particles and the third metal composite particles can be diffusion bonded to each other without forming Kirkendall voids. Therefore, an electronic device can be provided with the metallization layer 721 free from voids, cracks and disconnection.

Moreover, since the metallization layer 721 becomes a continuous layer free from voids, cracks and disconnection, the density and compactness of the metallization layer 721 can be increased. Therefore, an electronic device can be provided with the metallization layer 721 having a high electrical conductivity and high mechanical and physical strength.

Furthermore, since the metallization layer 721 is covered with the synthetic resin film 722, the metallization layer 721 can be prevented from being externally damaged and can also be improved in oxidation resistance, durability and weather resistance. Still furthermore, since the synthetic resin film 722 has adhesion strength and bond strength to the substrate 71 in addition to adhesion strength and bond strength of the metallization layer 721 itself, the whole metallization trace can be improved in adhesion strength and bond strength.

Figure 4:
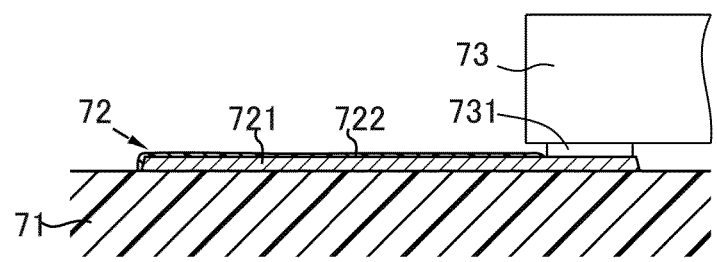
FIG. 4 is a drawing showing yet another embodiment of an electronic device employing a functional material according to the present invention.

In mounting an electronic component, as shown in FIG. 4, an external conductor or an electrode 731 of an electronic component 73 is connected to the metallization trace 72. Outside the connecting part, the metallization layer 721 remains covered with the synthetic resin film 722, so that the antioxidant effect due to the synthetic resin film 722 will not be impaired. This makes it possible to realize a metallization trace that has high reliability in electrical connection of the external conductor and the electronic component 73 to the metallization layer 721 and also has an antioxidant effect on the metallization layer 721.

Preferably, the synthetic resin film 722 is formed at the same time as the metallization layer 721. In this case, unlike in the case where the metallization layer 721 and the resin layer are formed at different times, the metallization layer 721 will not be exposed to air. Therefore, an electronic device can be provided with the high-quality metallization layer 721 that will not suffer from oxidation.

As a means for forming the synthetic resin film 722 and the metallization layer 721 at one time, a conductive paste in which the first, second and third metal composite particles are mixed with an organic binder of synthetic resin and a solvent may be applied to the substrate 71 in a predetermined pattern by using a printing technology and then subjected to a heat treatment. With this heat treatment, the first, second and third metal composite particles are melted in the chain reaction process and diffusion bonded together. The metallization layer 721 is formed by this diffusion bonding. The metallization layer 721 sinks below the synthetic resin film 722 because of the difference in specific gravity. Thus, there is formed the metallization trace 72, in which the outer surface of the metallization layer 721 adhered to the substrate 71 is covered with the synthetic resin film 722. The synthetic resin film 722 may have a thickness suitable for serving as an insulating film or a small thickness so as to put a higher priority on the antioxidant effect than on the insulation effect.

Figure 5:
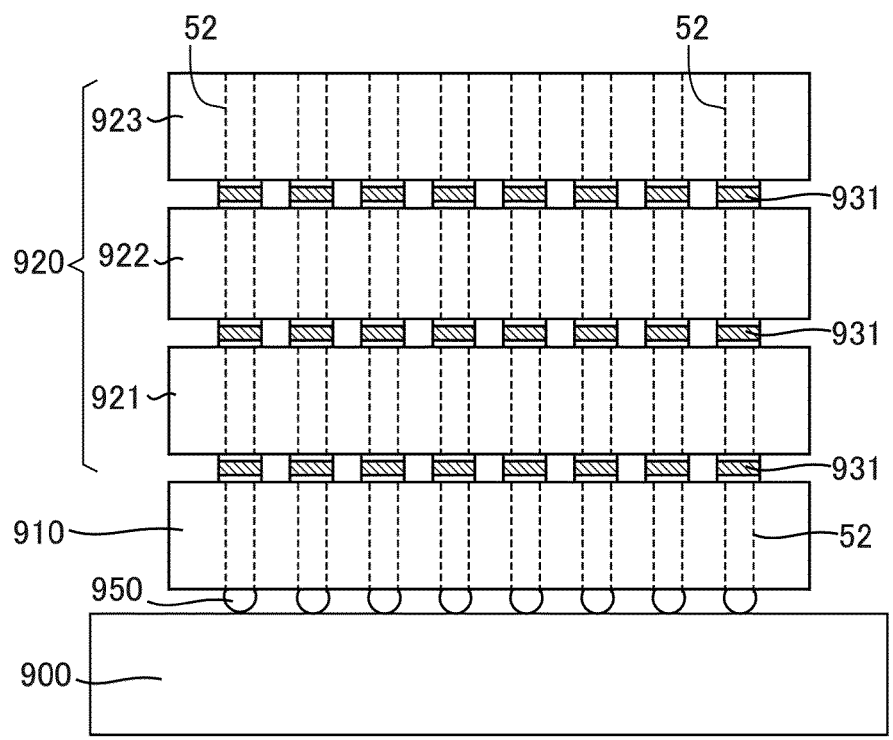
FIG. 5 is a drawing showing yet another embodiment of an electronic device employing a functional material according to the present invention.

FIG. 5 shows a three-dimensional electronic device in which a stack 920 including a plurality of semiconductor chips 921 to 923 is mounted on an interposer 910 according to the present invention and the interposer 910 is mounted on a motherboard 900. Columnar conductors 52 in the interposer 910 and the semiconductor chips 921 to 923 are bonded through a bonding material 931. The interposer 910 is bonded to the motherboard 900 through a ball grid 950 or the like.

Figure 6:
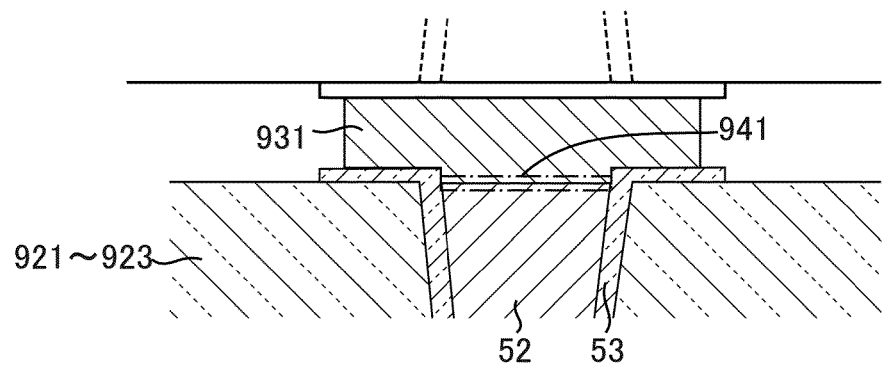
FIG. 6 is an enlarged partial sectional view showing a part of the electronic device in FIG. 5.

The bonding material 931 can be made of the functional material according to the present invention. Preferably, a nanocomposite brazing alloy or nanocomposite particles are employed as the bonding material 931. Then, as shown in FIG. 6 on an enlarged scale, one end of the columnar conductor 52 is liquid-phase or solid-phase diffusion bonded (indicated by 941) to another conductor, i.e., another columnar conductor 52 through the bonding material 931. Although not shown in the drawings, the diffusion bonding between the columnar conductor of FIGS. 1 and 2 and the metallization layer of FIGS. 3 and 4 may also be performed by the above-mentioned liquid-phase or solid-phase diffusion bonding.

Typically, the semiconductor chips 921 to 923 may be a memory chip or a logic chip. They may also be a system LSI, a memory LSI, an image sensor, a MEMS, an electronic device including an analog or digital circuit, a logic circuit such as CPU or the like, or an electronic device that is produced by preparing different types of circuits such as an analog high frequency circuit and a low frequency, low power consumption circuit in different processes and stacking them. Furthermore, they may be selected from most of electronic devices having an electronic circuit as a functional element, such as a sensor module, an optoelectronic module, a unipolar transistor, a MOS FET, a CMOS FET, a memory cell, integrated circuits (IC) thereof, or various scales of LSIs.

Figure 7:
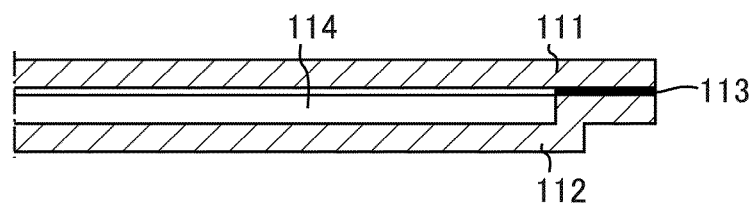
FIG. 7 is a drawing showing yet another embodiment of an electronic device employing a functional material according to the present invention.

On the other hand, FIG. 7 shows an embodiment in which the functional material according to the present invention is used as a sealing material. FIG. 7 shows an electronic device of, for example, a liquid crystal display, in which the outer edge at which a front panel 111 and a rear panel 112 are opposed to each other is sealed by a sealing layer 113, so that the internal space 114 between the front panel 111 and the rear panel 112 is secluded from the outside. The sealing layer 113 is made of the functional material according to the present invention. Thus, the sealing layer 113 can serve not only the essential sealing function such as airtightness and watertightness but also other functions such as electromagnetic shield and electrostatic shield.

In the foregoing embodiments shown in FIGS. 1 to 7, the functional material according to the present invention is used as the columnar conductor 52 (FIGS. 1 and 2), the metallization layer 721 (FIGS. 3 and 4), the bonding material 931 (FIGS. 5 and 6) and the sealing material 113 (FIG. 7). When the functional material according to the present invention is used, the asymmetry of interdiffusion due to a difference between the melting point T1(° C.) of the first metal composite particles and the melting point T3(° C.) of the third metal composite particles can be mitigated by the second metal composite particles having the intermediate melting point T2(° C.), so that the accumulation of atomic vacancies (lattice) can be avoided to suppress the formation of Kirkendall voids.

Figure 8:
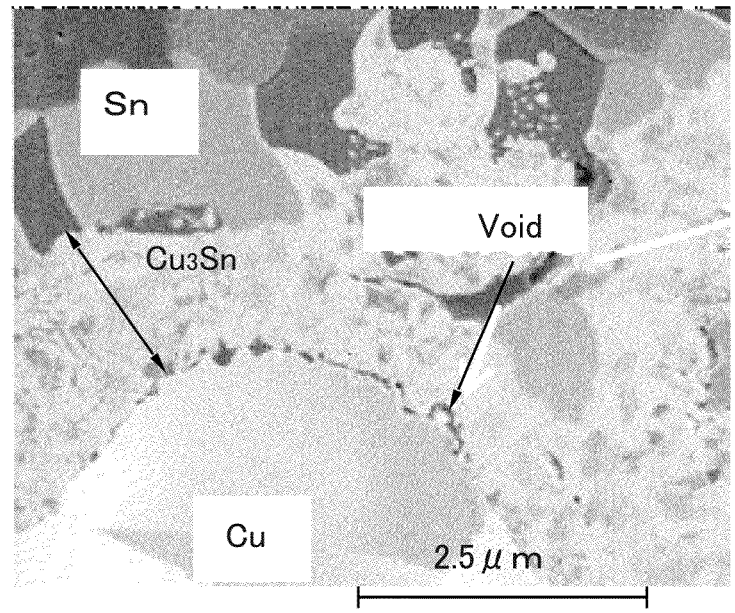
FIG. 8 is an SEM image of a trace formed with a conventional Sn—Cu conductive paste.

In this regard, description will be made with reference to SEM (scanning electron microscope) images shown in FIGS. 8 and 9. FIG. 8 shows the SEM image of a trace made of a conventional Sn—Cu conductive paste, while FIG. 9 shows the SEM image of a metallization layer (FIGS. 3 and 4) made of the functional material according to the present invention.

Referring first to FIG. 8 showing the SEM image of the trace made of the conventional Sn—Cu conductive paste, the diffusion layer of $Cu_3Sn$ exists at the interface between the Cu crystal and the Sn crystal, and the voids are formed almost all along the interface between the $Cu_3Sn$ layer and the Cu crystal.

Figure 9:
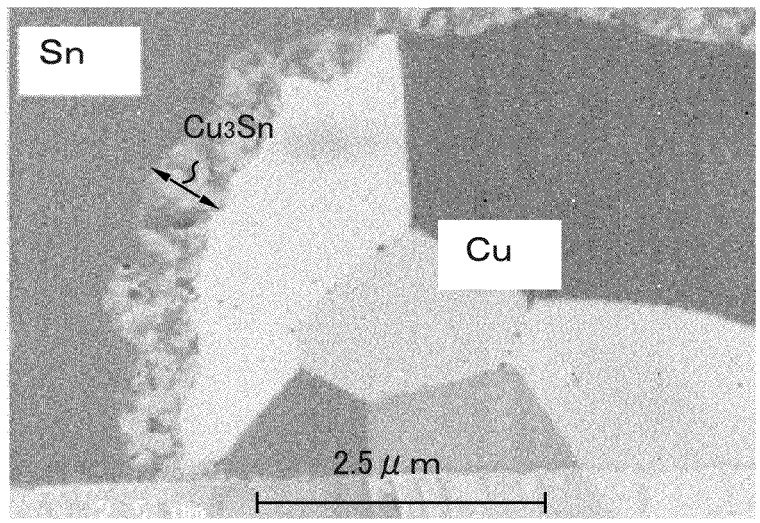
FIG. 9 is an SEM image of a metallization layer formed with a functional material according to the present invention.

Referring to FIG. 9, on the other hand, the diffusion layer of $Cu_3Sn$ formed at the interface between the Cu crystal grain and the Sn crystal grain in the metallization layer made of the functional material according to the present invention has a shape in conformity with the shape of the crystal grains, joining to the Cu crystal grain and the Sn crystal grain without having voids therebetween. As one characteristic feature, the diffusion layer of $Cu_3Sn$ constitutes a nanocomposite structure having a layer thickness of 700 nm or less. It should be noted that in FIG. 9, the difference in image color within the Cu crystal grain region comes from the difference in crystal orientation.

Figure 10:
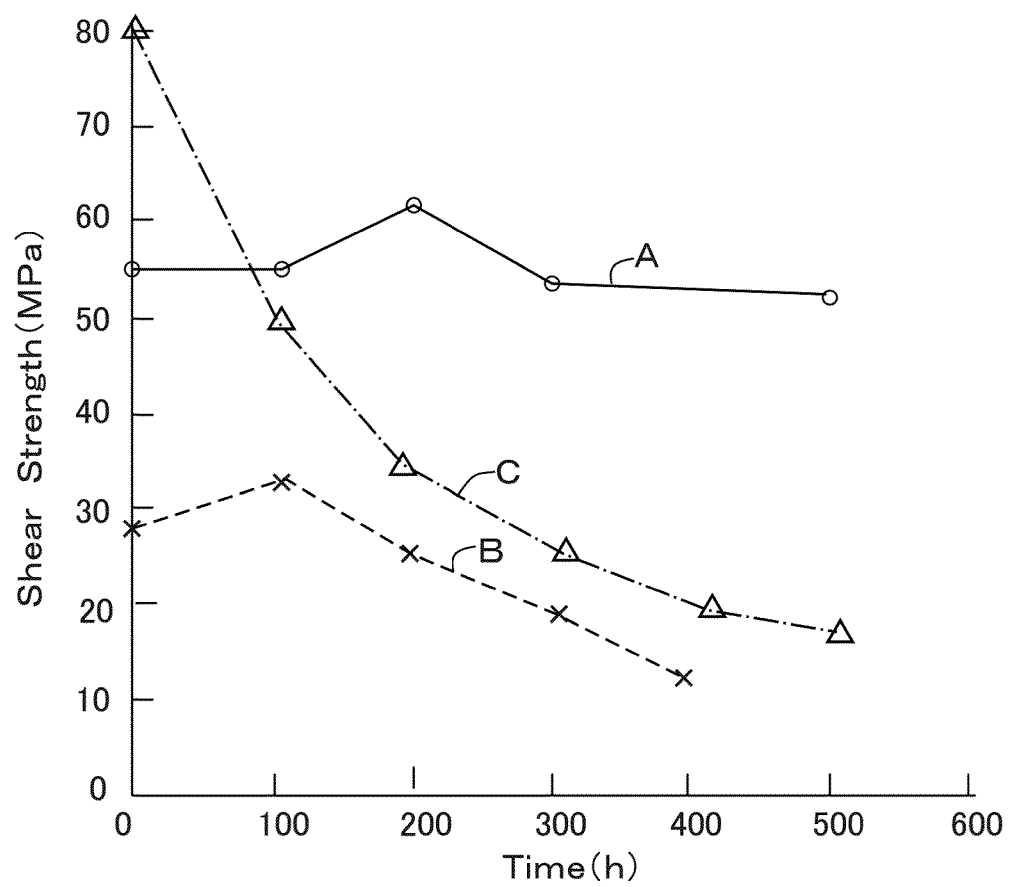
FIG. 10 is a drawing showing the results of high temperature shear strength test at 300° C.

Moreover, when tested for high temperature shear strength, the metallization layer made of the functional material according to the present invention exhibits a high retention reliability at high temperature. In this regard, description will be made with reference to FIG. 10. FIG. 10 is a drawing showing the results of high temperature shear strength test at 300° C., wherein time (h) is plotted in abscissa and shear strength (MPa) is plotted in ordinate. The curve A represents the shear strength characteristic of a metallization layer (FIGS. 3 and 4) made of the functional material according to the present invention; the curve B represents the shear strength characteristic of a trace made of a conductive paste disclosed in Japanese Patent No. 3869859; the curve C represents the shear strength characteristic of a conventional trace made of an Au-12Ge conductive paste.

At first, as indicated by the curve B, the shear strength of the trace made of the conductive paste disclosed in Japanese Patent No. 3869859 is as low as 30 (MPa) at the beginning and drops to 10 (MPa) at 400 hours.

Then, as indicated by the curve C, the shear strength of the conventional trace made of the Au-12Ge conductive paste is as high as 80 (MPa) at the beginning but rapidly decreases over time and drops to about 20 (MPa) at 500 hours.

On the other hand, as indicated by the curve A, the shear strength of the metallization layer made of the functional material according to the present invention is as high as 57 (MPa) at the beginning and remains about the same at 500 hours.

From the above, it is understood that since the metallization layer made of the functional material according to the present invention becomes a continuous layer free from voids, cracks and disconnection, the density and compactness of the metallization layer can be increased. Therefore, the metallization layer can be provided with a high electrical conductivity and high mechanical and physical strength.

Since FIGS. 8 to 10 illustrate the properties of the functional material according to the present invention itself, the experimental data in FIGS. 8 to 10 is also applicable to the columnar conductor (FIGS. 1 and 2), the bonding material (FIGS. 5 and 6) and the sealing material (FIG. 7) made of the same functional material.

Inside the columnar conductor 52 shown in FIGS. 1 and 2, accordingly, the diffusion layer of $Cu_3Sn$ formed at the interface between the Cu crystal grain and the Sn crystal grain has a shape in conformity with the shape of the crystal grains, joining to the Cu crystal grain and the Sn crystal grain without having voids therebetween, as shown in FIG. 9.

While the present invention has been particularly shown and described with respect to preferred embodiments thereof, it will be understood by those skilled in the art that various changes in form and detail may be made therein without departing from the spirit, scope and teaching of the invention.

What is claimed is:

1. A functional material, comprising:
    first metal composite particles comprising:
        99.9 wt % or less Cu as a main component,
        50 wt % or less of Sn, and
        at least one selected from the group consisting of 0.01 wt % or less of Si, 0.01 wt % or less of B, 0.01 wt % or less of Ti, 0.01 wt % or less of Al and 0.01 wt % or less of Ag,
    second metal composite particles comprising:
        98 wt % or less of Sn as a main component,
        30 wt % or less of Cu, and
        at least one element selected from the group consisting of 0.01 wt % or less of Si, 0.01 wt % or less of B, 0.01 wt % or less of Ti, 0.01 wt % or less of Al and 0.01 wt % or less or Ag,
    third metal composite particles comprising either (a) or (b):
        (a) the third metal composite particles comprises:
            40 to 80 wt % of Sn as a main component,
            15 to 60 wt % of Bi,
            0.1 wt % or less of Ga, and
            at least one element selected from the group consisting of 0.01 wt % or less of Si, 0.01 wt % or less of B, 0.01 wt % or less of Ti, 1 wt % or less of Al and 0.01 wt % or less of Ag, or
        (b) the third metal composite particles comprises:
            Sn as a main component,
            Bi at 20 wt % or less with respect to Sn,
            In at 20 wt % or less with respect to Sn,
            Sb at 20 wt % or less with respect to Sn,
            at least one element selected from the group consisting of 1 wt % or less of Ga, 1 wt % or less of Si, 1 wt % or less of B, 1 wt % or less of Ti, 1 wt % or less of Al and 1 wt % or less of Ag,
    wherein each of the first metal composite particles, the second metal composite particles and the third metal composite particles contains two or more kinds of metal components,
    wherein the melting point $T1(° C.)$ of the first metal composite particles, the melting point $T2(° C.)$ of the second metal composite particles and the melting point $T3(° C.)$ of the third metal composite particles satisfy a relationship of $T1>T2>T3$.

2. The functional material of claim 1, wherein the first metal composite particles, the second metal composite particles and the third metal composite particles are dispersed in a fluid dispersion medium.

3. An electronic device comprising a semiconductor substrate and a columnar conductor, the columnar conductor being made of the functional material of claim 1 and embedded in the semiconductor substrate in an electrically insulated state.

4. The electronic device of claim 3, further comprising an electronic element, wherein the electronic element is a wiring conductor, another electronic device or an electronic component, a conductive part of which is at least partially diffusion bonded to at least one of opposite ends of the columnar conductor.

5. The electronic device of claim 4, wherein another conductor is liquid-phase or solid-phase diffusion bonded to at least one of opposite ends of the columnar conductor with a nanocomposite brazing alloy or nanocomposite particles.

6. The functional material of claim 1, wherein the third metal composite particles comprises (a).

* * * * *